United States Patent
Hu et al.

(10) Patent No.: US 9,622,340 B2
(45) Date of Patent: Apr. 11, 2017

(54) FLEXIBLE CIRCUIT BOARD AND METHOD FOR MANUFACTURING SAME

(71) Applicants: HongQiSheng Precision Electronics (QinHuangDao) Co., Ltd., Qinhuangdao (CN); FuKui Precision Component (Shenzhen) Co., Ltd., Shenzhen (CN); Zhen Ding Technology Co., Ltd., Tayuan, Taoyuan (TW)

(72) Inventors: Xian-Qin Hu, Qinhuangdao (CN); Yan-Lu Li, Qinhuangdao (CN); Wen-Hsin Yu, New Taipei (TW); Ming-Jaan Ho, New Taipei (TW)

(73) Assignees: HongQiSheng Precision Electronics (QinHuangDao) Co., Ltd., Qinhuangdao (CN); GARUDA TECHNOLOGY CO., LTD., New Taipei (TW); FuKui Precision Component (Shenzhen) Co., Ltd., Shenzhen (CN)

( * ) Notice: Subject to any disclaimer, the term of this patent is extended or adjusted under 35 U.S.C. 154(b) by 18 days.

(21) Appl. No.: 14/858,953

(22) Filed: Sep. 18, 2015

(65) Prior Publication Data

US 2017/0027054 A1     Jan. 26, 2017

(30) Foreign Application Priority Data

Jul. 24, 2015   (CN) .......................... 2015 1 0441939

(51) Int. Cl.
*H05K 3/28*      (2006.01)
*H05K 1/02*      (2006.01)
*H05K 3/10*      (2006.01)

(52) U.S. Cl.
CPC .......... *H05K 1/0228* (2013.01); *H05K 1/028* (2013.01); *H05K 1/0237* (2013.01); *H05K 3/10* (2013.01); *H05K 3/28* (2013.01)

(58) Field of Classification Search
USPC .......................................... 439/492; 174/251
See application file for complete search history.

(56) References Cited

U.S. PATENT DOCUMENTS 6,882,858 B1 * 4/2005 Hosonuma ........... H05K 9/0039
                                                                 333/247
7,645,941 B2 * 1/2010 Wesselman .......... H05K 1/0221
                                                                 174/251

(Continued)

*Primary Examiner* — Timothy Thompson
*Assistant Examiner* — Krystal Robinson
(74) *Attorney, Agent, or Firm* — Zhigang Ma (57) ABSTRACT

A flexible circuit board includes an insulating layer, a linear signal line, a plurality of grounding lines, a metal coating layer, a circuit layer and an electromagnetic shielding layer. The insulating layer includes a first face and a second face. The metal coating layer covers the linear signal line on the first face. The metal coating layer has a thickness less than that of the linear signal line, and an electrical conductivity larger than that of the linear signal line. The grounding lines are at two opposite sides of the linear signal line on the first face. The circuit layer is on the second face. The electromagnetic shielding layer covers the linear signal line and the grounding lines. The linear signal line and the grounding lines are between the electromagnetic shielding layer and the circuit layer. A method for manufacturing the flexible circuit board is also provided.

20 Claims, 8 Drawing Sheets

(56) References Cited

U.S. PATENT DOCUMENTS

| | | | | |
|---|---|---|---|---|
| 2001/0033478 A1* | 10/2001 | Ortiz | ............... | H01R 13/6599 |
| | | | | 361/818 |
| 2001/0040794 A1* | 11/2001 | Shimizu | ............... | H05K 3/4617 |
| | | | | 361/749 |
| 2006/0068613 A1* | 3/2006 | Tsukada | ............... | H05K 1/028 |
| | | | | 439/67 |
| 2008/0236868 A1* | 10/2008 | Koga | ............... | H01B 7/0861 |
| | | | | 174/117 F |
| 2008/0296048 A1* | 12/2008 | Muro | ............... | H05K 1/0218 |
| | | | | 174/254 |
| 2008/0302559 A1* | 12/2008 | Leedy | ............... | G03F 7/70658 |
| | | | | 174/254 |

* cited by examiner

FLEXIBLE CIRCUIT BOARD AND METHOD FOR MANUFACTURING SAME

FIELD

The subject matter herein generally relates to printed circuit boards, and particularly to a flexible circuit board and a method for manufacturing the flexible circuit board.

BACKGROUND

Generally, flexible circuit boards are light, soft, thin, small, ductile, flexible, and supporting high wiring density. Flexible circuit boards can be three-dimensionally wired and shaped according to space limitations. Flexible circuits are generally useful for electronic packages where flexibility, weight control and the like are important.

Figure 11:
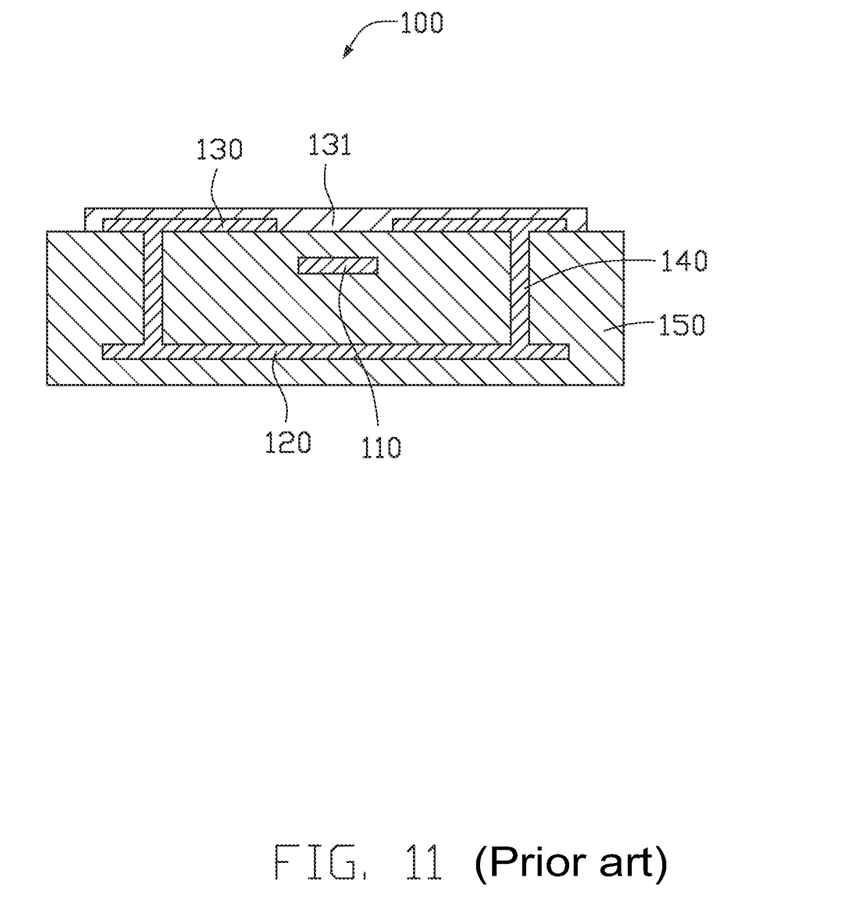
FIG. 11 is a cross sectional view of a high frequency signal line structure of a conventional flexible circuit board.
Figure 12:
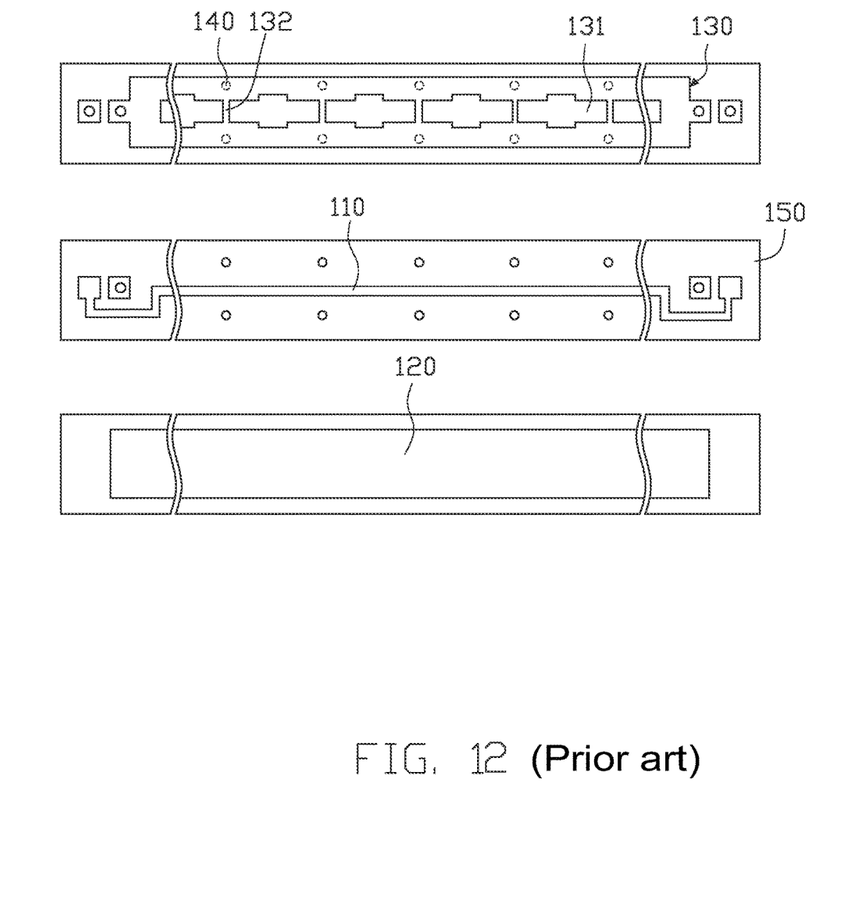
FIG. 12 is a top view of layers of the high frequency signal line structure in FIG. 11.
Figure 13:
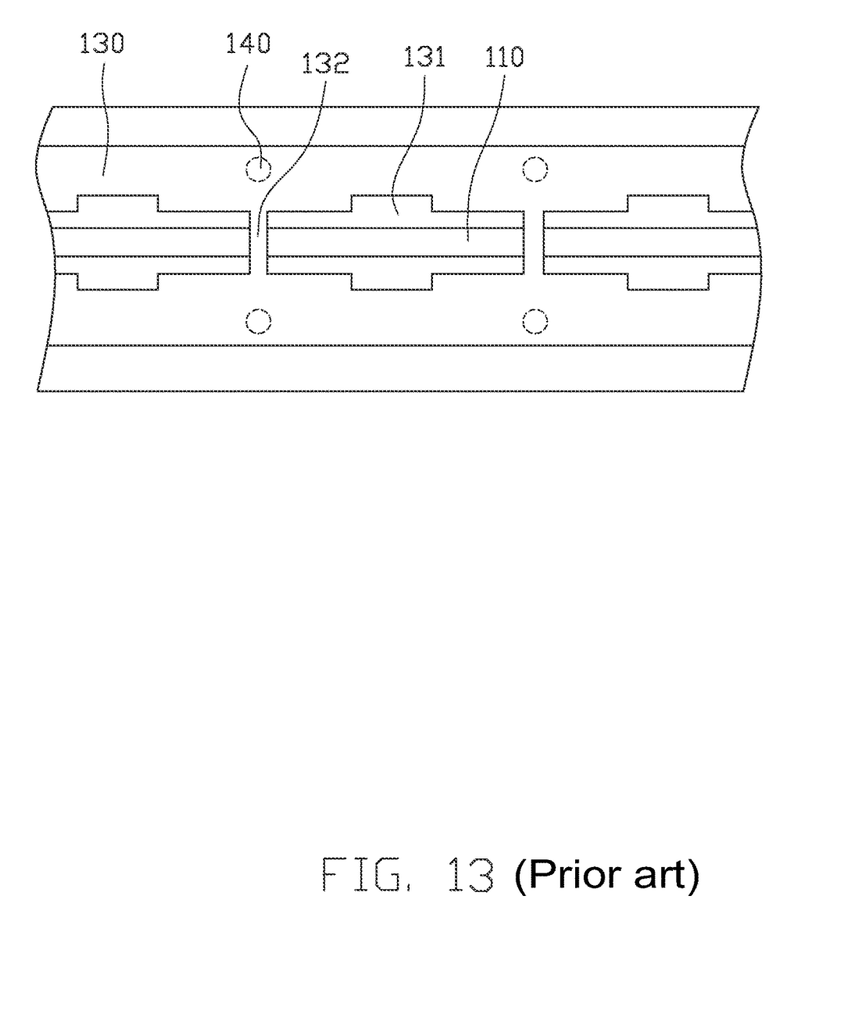
FIG. 13 is a top view of a second grounding circuit layer in FIG. 12.

FIG. 11 illustrates a high frequency signal line structure 100 of a conventional flexible circuit board. The high frequency signal line structure 100 includes a dielectric layer 150, a signal line 110, a first grounding circuit layer 120, a second grounding circuit layer 130 and a plurality of conductive holes 140. The first grounding circuit layer 120, the second grounding circuit layer 130 and the conductive holes 140 collectively surround the signal line 110 and are layered in the dielectric layer 150. FIG. 12 and FIG. 13 illustrate that the second grounding circuit layer 130 includes a plurality of openings 131 and a plurality of bridges 132. The openings 131 and the bridges 132 are alternately arranged in the second grounding circuit layer 130 and expose portions of the signal line 110. The conductive holes 140 are formed at two opposite sides of the plurality of bridges 132 and electrically connect the first grounding circuit layer 120 and the second grounding circuit layer 130.

However, the high frequency signal line structure 100 still has a problem of serious signal loss when the signals are transmitted.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a flexible circuit board. The flexible circuit board can include an insulating layer, a linear signal line, a plurality of grounding lines, a metal coating layer, a circuit layer and an electromagnetic shielding layer. The insulating layer can include a first face and a second face opposite to the first face. The linear signal line is located on the first face of the insulating layer. The metal coating layer covers the linear signal line on the first face of the insulating layer. The metal coating layer has a thickness less than that of the linear signal line, and an electrical conductivity larger than that of the linear signal line. The plurality of grounding lines are located on the first face of the insulating layer, and located at two opposite sides of the linear signal line. The circuit layer is located on the second face of the insulating layer. The electromagnetic shielding layer covers the linear signal line and the grounding lines. The linear signal line and the grounding lines are located between the electromagnetic shielding layer and the circuit layer.

The present disclosure is described further in relation to a method for manufacturing a flexible circuit board. The method can include followings. An insulating layer is provided and comprises a first face and a second face opposite to the first face. A linear signal line and a plurality of grounding lines are formed. The grounding lines are located at two opposite sides of the linear signal line on the first face of the insulating layer. A circuit layer is formed on the second face of the insulating layer. A metal coating layer is formed to cover surfaces of the linear signal line. The metal coating layer has a thickness less than that of the linear signal line and an electrical conductivity larger than that of the linear signal line. An electromagnetic shielding layer is provided to cover the linear signal line and the grounding lines to make the linear signal line located between the electromagnetic shielding layer and the circuit layer.

Figure 1:
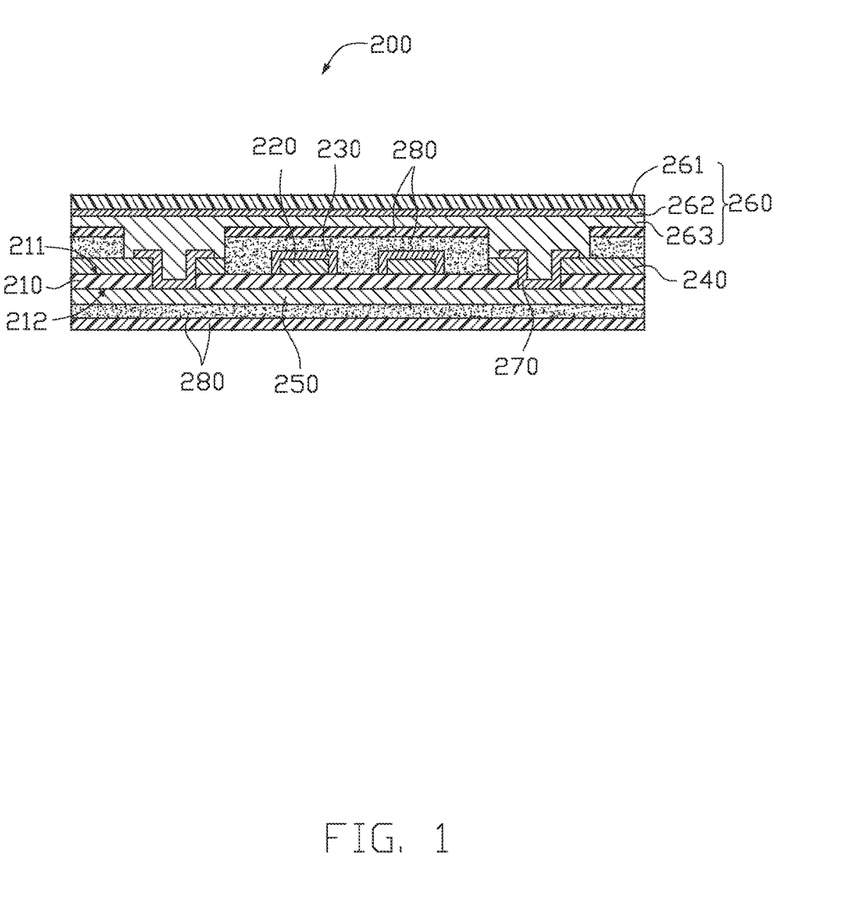
FIG. 1 is a cross sectional view of a flexible circuit board in accordance with an embodiment of the present disclosure.

FIG. 1 illustrates a flexible circuit board 200, which can be configured to transmit high frequency signals. The flexible circuit board 200 can include an insulating layer 210, a linear signal line 220, a plurality of grounding lines 240, a circuit layer 250 and an electromagnetic shielding layer 260. The linear signal line 220 and the plurality of grounding lines 240 are located at a first side of the insulating layer 210. The circuit layer 250 is located at a second side opposite to the first side of the insulating layer 210. The electromagnetic shielding layer 260 covers the linear signal line 220 and the plurality of grounding lines 240.

The insulating layer 210 can include a first face 211 and a second face 212 opposite to the first face 211. The insulating layer 210 can be a base layer of the flexible circuit board 200 to support the linear signal line 220, the plurality of grounding lines 240, the circuit layer 250 and the electromagnetic shielding layer 260. In the illustrated embodiment, the insulating layer 210 is flexible. In at least one embodiment, the insulating layer 210 is polyimide (PI).

The linear signal line 220 is located on the first face 211 of the insulating layer 210. The linear signal line 220 can be copper which has better ductility, flexible, and electrical conductivity which is about $5.85 \times 10^7$ Siemens/m (S/m).

In at least one embodiment, the linear signal line 220 is covered by a metal coating layer 230 on the first face 211 of the insulating layer 210. The linear signal line 220 is located between the metal coating layer 230 the first face 211.

The coating layer 230 can enclose the linear signal line 220 on the first face 211 of the insulating layer 210. The coating layer 230 covers the linear signal line 220 from at least three surfaces of the linear signal line 220 on the first face 211. In at least one embodiment, the coating layer 230 can be coated to all surfaces of the linear signal line 220 except a surface of the linear signal line 220 contacting the first face 211 of the insulating layer 210.

The metal coating layer 230 has an electrical conductivity larger than that of the linear signal line 220. The metal coating layer 230 can be silver which has an electrical conductivity about $6.3 \times 10^7$ Siemens/m (S/m). The metal coating layer 230 has a thickness less than that of the linear signal line 220. The metal coating layer 230 can be made by electroplating or chemical deposit which is facilitated to control the thickness of the metal coating layer 230, to make the metal coating layer 230 in line with skin depth.

The skin depth is thickness of a conductor where the electric current flows through. In details, due to the high frequency signal during transmission having obvious skin effect, namely when high frequency electric current flows through a conductor, the electric current will not flow through a central portion of the conductor, but tend to flow through a skin or surface of the conductor. Therefore, the skin effect makes effective area of the conductor reduced, thus increasing resistance. When the higher the frequency, the skin effect is more obvious. In other words, when the flexible circuit board 200 transmits high frequency signals, and the transmission frequency arrives at a certain range, the high frequency signals will be intensively transmitted by the metal coating layer 230 on the surfaces of the linear signal line 220, which reduces the loss of high frequency signal transmission.

The plurality of grounding lines 240 are located on the first face 211 of the insulating layer 210. The grounding lines 240 are located at two opposite sides of the linear signal line 220. The grounding lines 240 can be parallel to each other. Each of the grounding lines 240 can have a thickness equal to that of the linear signal line 220.

The circuit layer 250 is connected to the second face 212 of the insulating layer 210. The circuit layer 250 can be in a configuration of a grid pattern or an integrated copper face.

In at least one embodiment, the flexible circuit board 200 can further include a plurality of conductive members 270 electrically connecting the grounding lines 240 with the circuit layer 250. The conductive members 270 can be evenly and spaced distributed in flexible circuit board 200. Each of the conductive members 270 can be in a shape of hollow cylinder. Each of the conductive members 270 can include a first coupling portion connected to the circuit layer 250, a second coupling portion connected to a corresponding line 240, and a wall portion connecting the first coupling portion and the second coupling portion. The first coupling portion is surrounded by the wall portion at a first end of the wall portion. The second coupling portion surrounds the wall portion at a second end of the wall portion. The wall portion extends through the grounding line 240 and the insulating layer 210.

When the circuit layer 250 is electrically connected to the grounding lines 240 via the conductive members 270, the circuit layer 250 can be grounded and provide electromagnetic shielding on the second face 212 of the insulating layer 210.

The electromagnetic shielding layer 260 is covered on the linear signal line 220 and the grounding lines 240. The linear signal line 220 is located between the electromagnetic shielding layer 260 and the circuit layer 250.

The electromagnetic shielding layer 260 can include a protecting film 261, a metal film 262 and a glue layer 263. The protecting film 261 is connected to a first surface of the metal film 262. The glue layer 263 is connected to a second surface of the metal film 262 opposite to the first surface. The metal film 262 is located between the protecting film 261 and the glue layer 263. The glue layer 263 is connected to the linear signal line 220 and the grounding lines 240, thereby connecting the metal film 262 and the protecting film 261 on the linear signal line 220 and the grounding lines 240. The glue layer 263 is connected to and filed into the conductive members 270.

In at least one embodiment, the electromagnetic shielding layer 260 can be a compound-film layer including the protecting film 261, the metal film 262 and the glue layer 263, which can be directly connected the linear signal line 220 and the grounding lines 240 via the glue layer 263. In at least one alternative embodiment, the electromagnetic shielding layer 260 can also be connected to the linear signal line 220 and the grounding lines 240 via coating the glue layer 263 to the linear signal line 220 and the grounding lines 240, electroplating or chemical depositing the metal film 262 on the glue layer 263, then covering the protecting film 261. Alternatively, the electromagnetic shielding layer 260 can only be a conductive silver foil.

In the illustrated embodiment, the flexible circuit board 200 can further include a protecting layer 280 between the insulating layer 210 and the electromagnetic shielding layer 260. The protecting layer 280 covers the metal coating layer 230, the linear signal line 220 and the grounding lines 240, and exposes the conductive members 270 to the glue layer 263 of the electromagnetic shielding layer 260. The protecting layer 280 separates the metal coating layer 230 and linear signal line 220 from the electromagnetic shielding layer 260.

In the illustrated embodiment, the flexible circuit board 200 include two linear signal lines 220, the protecting layer 280 covers the two linear signal lines 220 on the first face 211 of the insulating layer 210. The protecting layer 280 can be filled between the two linear signal lines 220. In at least one embodiment, the protecting layer 280 encloses the two linear signal lines 220 together on the first face 211.

The flexible circuit board 200 can further include an additional protecting layer 280 covering the circuit layer 250. The circuit layer 250 is located between the additional protecting layer 280 and the insulating layer 210.

Figure 2:
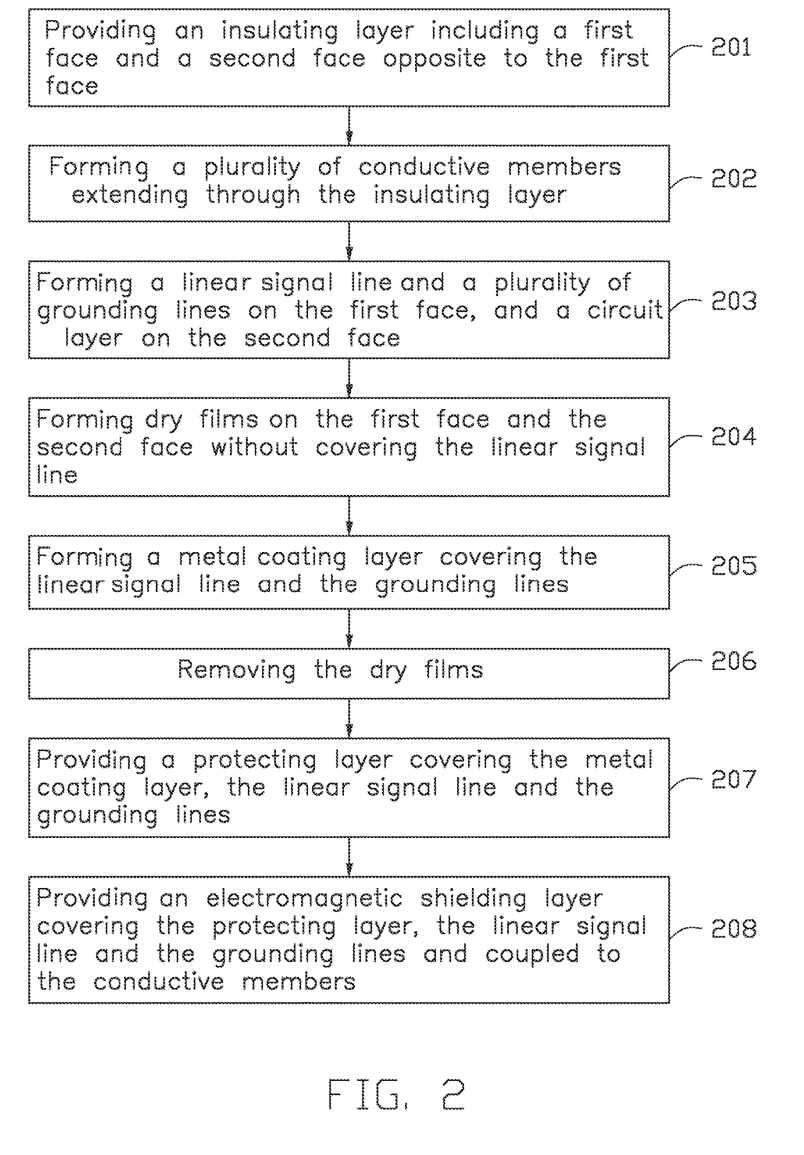
FIG. 2 is a flowchart of a method for manufacturing the flexible circuit board in FIG. 1.

FIG. 2 illustrates a flowchart of an example method for manufacturing the flexible circuit board 200. The example method is provided by way of example, as there are a variety of ways to carry out the method. The example method described below can be carried out using the configurations illustrated in FIGS. 1 and 3-10, for example, and various elements of these figures are referenced in explaining the example method. Each block shown in FIG. 2 represents one or more processes, methods or subroutines, carried out in the example method. Furthermore, the illustrated order of blocks is illustrative only and the order of the blocks can change according to the present disclosure. Additional blocks can be added or fewer blocks may be utilized, without departing from this disclosure. The example method can begin at block 201.

Figure 3:
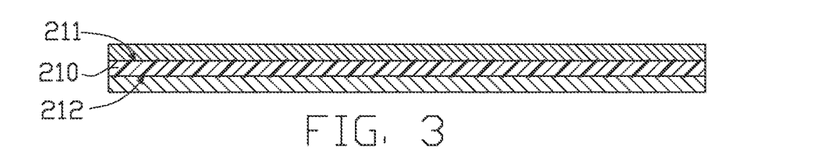
FIG. 3 is a cross sectional view of an insulating layer of the flexible circuit board in FIG. 1 with copper foils.

At block 201, also referring to FIG. 3, an insulating layer 210 is provided. The insulating layer 210 can include a first face 211 and a second face 212 opposite to the first face 211. In at least one embodiment, the insulating layer 210 is a two-sided flexible copper foil laminate (FCCL). The first face 211 and the second 212 each have a copper foil formed thereon. The copper foil has a thickness of about 17 micrometers (½ ounces), 12 micrometers (⅓ ounces), or others according to different demands.

Figure 4:
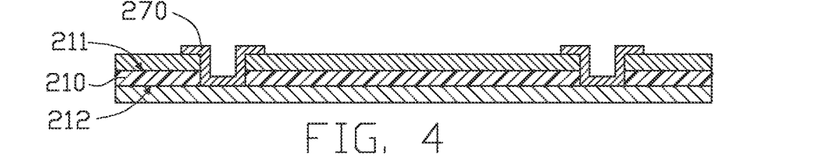
FIG. 4 is a cross sectional view of the insulating layer, the copper foils in FIG. 3 with conductive members formed therein.
Figure 9:
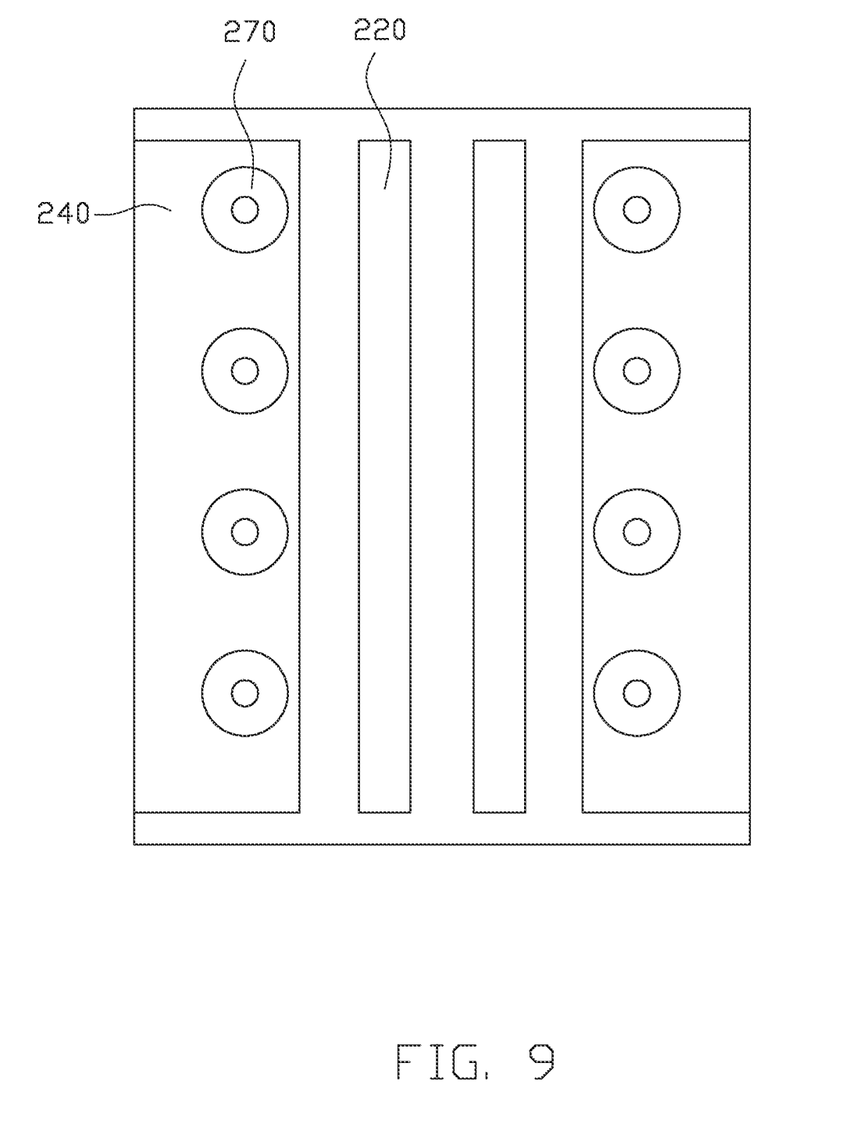
FIG. 9 is a plan view of structure in FIG. 4.

At block 202, also referring to FIG. 4 and FIG. 9, a plurality of conductive members 270 are formed to electrically connecting the copper foil on the first face 211 and the copper foil on the second face 212 of the insulating layer 210. Each conductive member 270 extends through the copper foil on the first face 211 and the insulating layer 210 and is connected to the copper foils. The conductive members 270 can be evenly connected to the insulating layer 210.

Figure 5:
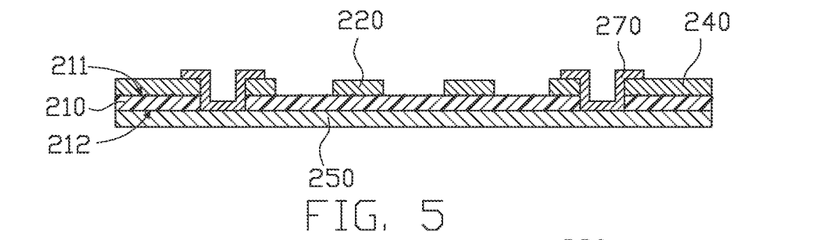
FIG. 5 is a cross sectional view of a structure in FIG. 4 with grounded lines, signal lines and a circuit formed.

At block 203, also referring to FIG. 5, the copper foils on the first face 211 and the second face 212 are etched to form a linear signal line 220, a plurality of grounding lines 240 on the first face 211 of the insulating layer 210, and a circuit on the second face 212 of the insulating layer 210. The grounding lines 240 are located at two opposite sides of the linear signal line 220. The grounding lines 240 can be parallel to each other.

Figure 6:
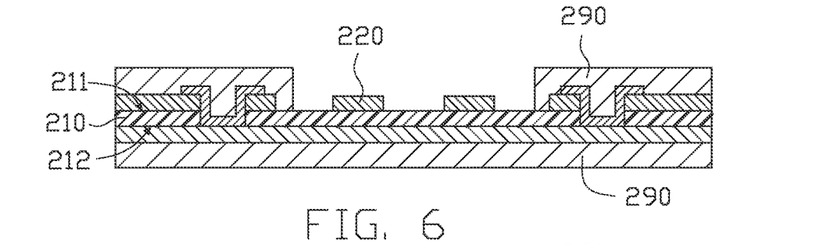
FIG. 6 is a cross sectional view of a structure in FIG. 5 with dry films.

At block 204, also referring to FIG. 6, dry films 290 are formed on the first face 211 and the second face 212 of the insulating layer 210 without covering the linear signal line 220 and the first face 211 adjacent to the linear signal line 220. The dry films 290 cover and protect the grounding lines 240, the conductive members 270, the first face 211 adjacent to the grounding lines 240 and the circuit layer 250 from solutions. The dry film 290 can be a solid configuration directly covering the grounding lines 240, the conductive members 270 and the first face 211 adjacent to the grounding lines 240. Alternatively, the dry film 290 can be a liquid configuration coated to the conductive members 270 and the first face 211 adjacent to the grounding lines 240, and then dried.

Figure 7:
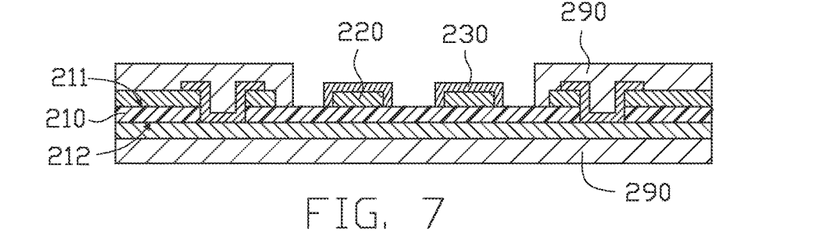
FIG. 7 is a cross sectional view of a structure in FIG. 6 with metal coating layers.

At block 205, also referring to FIG. 7, a metal coating layer 230 is formed on surfaces of the linear signal line 220 by electroplating or chemical deposit. The metal coating layer 230 has a thickness less than that of the linear signal line 220. When the higher the transmission frequency of the high frequency signals, a minim thickness of the metal coating layer 230 is smaller. The high frequency signals are signals having the frequency larger than 1 G hertz.

Figure 10:
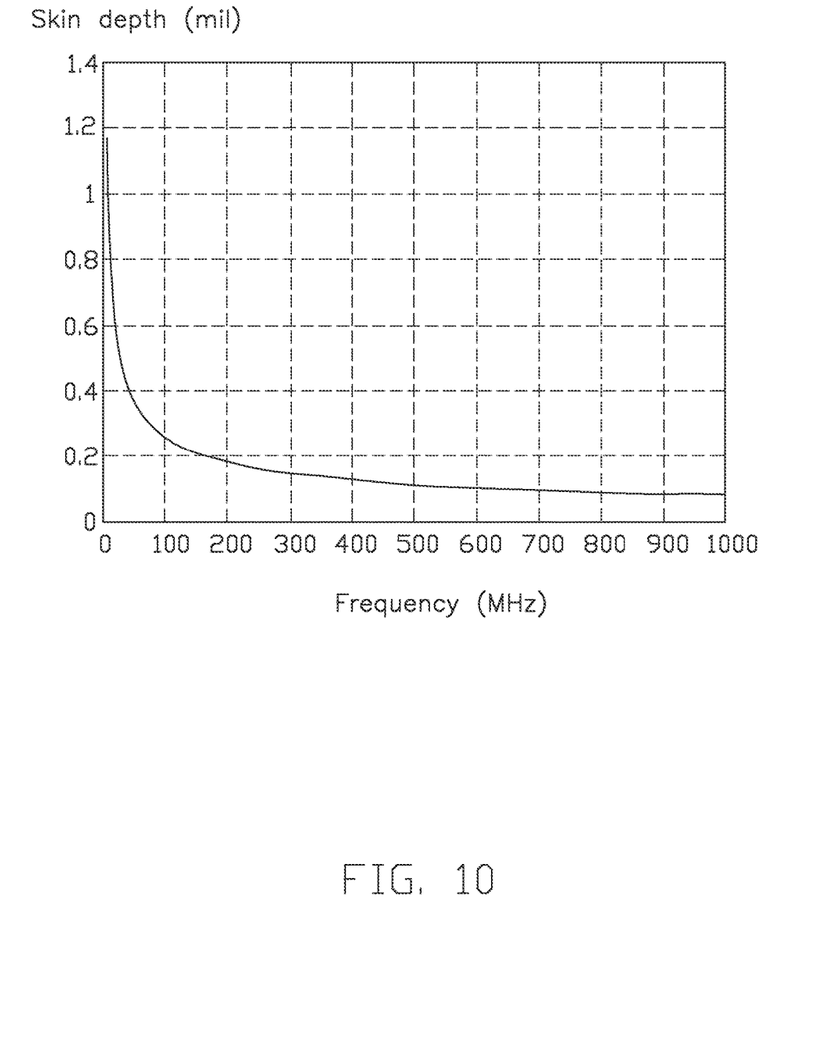
FIG. 10 shows a relationship between frequency and skin depth.

FIG. 10 illustrates a relationship between the frequency and the skin depth. When the frequency is 100 hertz, a corresponding skin depth is 0.26 mil (6.5 micrometers), which is less than the thickness of the linear signal line 220 which is at least 17.5 micrometers. The thickness of the metal coating layer 230 can be adjusted according to different demands of frequencies of the high frequency signals, to in line with different skin depths. For example, when the frequency of the high frequency signals is 1 G hertz, the thickness of the metal coating layer 230 is at least 2.1 micrometers. When the frequency of the high frequency signal is 5 G hertz, the thickness of the metal coating layer 230 is at least 0.9 micrometers. The metal coating layer 230 has an electrical conductivity larger than that of the linear signal line 220. In at least one embodiment, the metal coating layer 230 can be silver.

Figure 8:
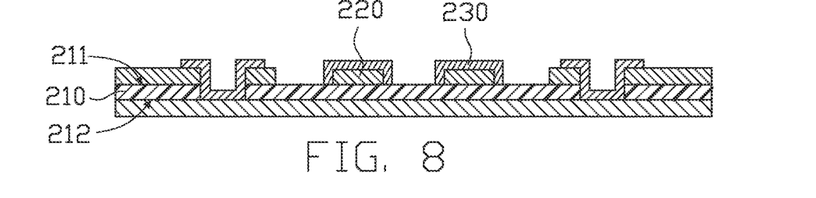
FIG. 8 is a cross sectional view of a structure in FIG. 7 with the dry films removed.

At block 206, also referring to FIG. 8, the dry films 290 are removed from the first face 211 and the second face 212 of the insulating layer 210 after the metal coating layer 230 is formed.

At block 207, also referring to FIG. 4, a protecting layer 280 covers the metal coating layer 230, the linear signal line 220 and the grounding lines 240, and exposes the conductive members 270. The protecting layer 280 protects the linear signal line 220 and the metal coating layer 230 from directly contacting other components. An additional protecting layer 280 can also cover the circuit layer 250 to protect the circuit layer 250 from oxidation or damage. The circuit layer 250 is located between the insulating layer 210 and the additional protecting layer 280.

At block 208, also referring to FIG. 4, an electromagnetic shielding layer 260 is covered on protecting layer 280, the linear signal line 220 and the grounding lines 240 and filled into the conductive members 270. In at least one embodiment, the electromagnetic shielding layer 260 directly contacts the protecting layer 280 and the conductive members 270. The linear signal line 220 is located between the electromagnetic shielding layer 260 and the circuit layer 250.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:
1. A flexible circuit board comprising:
an insulating layer comprising a first face and a second face opposite to the first face;
a linear signal line located on the first face of the insulating layer;
a metal coating layer covering the linear signal line on the first face of the insulating layer, and having a thickness less than that of the linear signal line, and an electrical conductivity larger than that of the linear signal line;
a plurality of grounding lines located on the first face of the insulating layer, and located at two opposite sides of the linear signal line;
a circuit layer located on the second face of the insulating layer; and an electromagnetic shielding layer covering the linear signal line and the grounding lines;

wherein the linear signal line and the grounding lines are located between the electromagnetic shielding layer and the circuit layer.

2. The flexible circuit board of claim 1, further comprising a protecting layer covering the linear signal line, wherein the protecting layer is located between the linear signal line and the electromagnetic shielding layer.

3. The flexible circuit board of claim 2, wherein the protecting layer further covers the grounding lines.

4. The flexible circuit board of claim 2, wherein the protecting layer separates the linear signal line and the metal coating layer from the electromagnetic shielding layer.

5. The flexible circuit board of claim 4, wherein the protecting layer encloses the metal coating layer and the linear signal line on the insulating layer.

6. The flexible circuit board of claim 2, further comprising a plurality of conductive members electrically connecting the grounding lines and the circuit layer.

7. The flexible circuit board of claim 6, wherein each of the conductive members extends through a corresponding grounding lines and the insulating layer.

8. The flexible circuit board of claim 7, wherein the protecting layer exposes the conductive members to the electromagnetic shielding layer.

9. The flexible circuit board of claim 8, wherein the electromagnetic shielding layer covers the conductive members.

10. The flexible circuit board of claim 1, further comprising a protecting layer covering the circuit layer, wherein the circuit layer is located between the insulating layer and the protecting layer.

11. The flexible circuit board of claim 1, wherein the metal coating layer is silver.

12. The flexible circuit board of claim 1, wherein the grounding lines are parallel to each other.

13. A method for manufacturing a flexible circuit board, comprising:

providing an insulating layer comprising a first face and a second face opposite to the first face;

forming a linear signal line and a plurality of grounding lines at two opposite sides of the linear signal line on the first face of the insulating layer;

forming a circuit layer on the second face of the insulating layer;

forming a metal coating layer covering surfaces of the linear signal line, the metal coating layer having a thickness less than that of the linear signal line and an electrical conductivity larger than that of the linear signal line; and providing an electromagnetic shielding layer covering the linear signal line and the grounding lines to make the linear signal line located between the electromagnetic shielding layer and the circuit layer.

14. The method of claim 13, before forming the linear signal line, further comprising:

forming a plurality of conductive members extending through the insulating layer.

15. The method of claim 14, wherein each of the conductive members extends through a corresponding grounding line and the insulating layer and connects a corresponding grounding line and the circuit layer.

16. The method of claim 14, before providing the electromagnetic shielding layer, further comprising: providing the protecting layer covering the linear signal line and the grounding lines, the protecting layer exposing the conductive members.

17. The method of claim 16, wherein the protecting layer separates the linear signal line and the metal coating layer from the electromagnetic shielding layer.

18. The method of claim 13, wherein the metal coating layer is formed by electroplating or chemical deposit.

19. The method of claim 18, wherein the metal coating layer is silver.

20. The method of claim 13, wherein the linear signal line and the grounding lines are formed by etching a copper foil on the first face of the insulating layer.

* * * * *